United States Patent [19]

Liu

[11] Patent Number: 5,488,201
[45] Date of Patent: Jan. 30, 1996

[54] LOW CROSSTALK ELECTRICAL SIGNAL TRANSMISSION MEDIUM

[75] Inventor: Danny Liu, Taipei, Taiwan

[73] Assignee: Dan-Chief Enterprise Co., Ltd., Taipei, Taiwan

[21] Appl. No.: 357,390

[22] Filed: Dec. 16, 1994

[51] Int. Cl.⁶ ................................................ H05K 1/02
[52] U.S. Cl. ........................ 174/262; 174/250; 174/254; 361/748; 333/12
[58] Field of Search ....................... 174/254, 262, 174/250; 361/748; 336/200; 333/1, 12; 439/607, 676, 894.1

[56] References Cited

U.S. PATENT DOCUMENTS

| | | | |
|---|---|---|---|
| 5,186,647 | 2/1993 | Denkmann et al. | 439/395 |
| 5,295,869 | 3/1994 | Siemon et al. | 439/620 |
| 5,299,956 | 4/1994 | Brownell et al. | 439/638 |
| 5,319,342 | 6/1994 | Kuroki | 336/170 |
| 5,322,972 | 6/1994 | Walston | 174/250 |
| 5,326,284 | 7/1994 | Bohbot et al. | 439/676 |
| 5,341,419 | 8/1994 | Ferry | 379/417 |
| 5,362,257 | 11/1994 | Neal et al. | 439/676 |

*Primary Examiner*—Laura Thomas
*Attorney, Agent, or Firm*—Christie, Parker & Hale

[57] ABSTRACT

A low crosstalk electrical signal transmission medium includes a plurality of input ends, a plurality of output ends and a plurality of signal transmission lines respectively electrically connected between the input ends and the output ends. The signal transmission line is folded into bends to form a mutually corresponding capacitive arrangement for restoring electric balance of the signal transmission line and reducing crosstalk between signal transmission lines.

14 Claims, 3 Drawing Sheets

LOW CROSSTALK ELECTRICAL SIGNAL TRANSMISSION MEDIUM

FIELD OF THE INVENTION

The present invention relates to a transmission medium, and more particularly to a low crosstalk electrical signal transmission medium.

BACKGROUND OF THE INVENTION

When a pair of conductors is applied with an electrical signal of a given signal frequency, conductors will transmit unequal parts of signal energy to conductors of an adjacent pair of conductors. The crosstalk phenomenon arises if the capacitive and inductive coupling between adjacent conductors is substantially higher than the couplings of the other conductor of the signal pair. Parameters that affect crosstalk includes the space between adjacent conducting wires, the dielectric constants among materials of conducting wire and the signal frequency of each signal pair.

The crosstalk phenomenon will be much more serious due to the small space among conducting wires in cables and jacks, which, especially for high speed transmission, will thereby cause the transmission quality to be unacceptable. Therefore, the Federal Communications Commission (FCC, U.S.) adopted guidelines about electrical connectors applied in telecommunication industry to provide intermateability The primary reference, considered by many to be the international benchmark for commercially based telecommunication components and installations, is standard ANSI/EIA/TIA-568 (TIA-568) which is supplemented by TIA/EIA TSB40 (TSB40). Transmission parameters defined in TSB40 for an unshielded twisted pair (UTP) connector include attenuation, near-end crosstalk (NEXT) and return loss. Since crosstalk coupling is greatest between transmission segments close to the signal source, it is expressed in decibels as a frequency dependent value. The higher the NEXT loss magnitude, the better the crosstalk performance.

In the past, transmission requirements for Category 3 components are specified up to 16 MHz, while Category 4 components are specified up to 20 MHz. Nowadays, the requirements for Category 5 are specified up to 100 MHz. Though there are many types of commercially available pans that satisfy Category 5, they are still subjected to custom design and re-tooling. So, both The Siemon Company and Superior Modular Products, Inc. in the U.S. respectively designed common products which have already been patented under U.S. Pat. No. 5,295,869 and No. 5,299,956.

SUMMARY OF THE INVENTION

The object of the present invention is to provide an electrical signal transmission medium capable of successfully satisfying transmission requirements for Category 5 in a different manner.

In accordance with the present invention, a low crosstalk electrical signal transmission medium includes a plurality of input ends for inputting therethrough signals, a plurality of signal transmission lines respectively electrically connected to the plurality of input ends and being folded into bends to form a mutually corresponding capacitive arrangement for restoring an electric balance of the signal transmission lines in order to reduce a crosstalk between the signal transmission lines, and a plurality of output ends respectively electrically connected to the signal transmission lines for outputting therethrough signals.

Preferably, a low crosstalk electrical signal transmission medium is formed into a printed circuit board, wherein each of the signal transmission lines is formed on both sides of the printed circuit board and the two portions of the signal transmission lines provided on both sides of the printed circuit board are mutually corresponding. Each one of the input ends and the output ends passes the printed circuit board through a through hole which is filled with brass foil.

In accordance with the present invention, each of the signal transmission lines comprises a first end near a corresponding input end and a second end near a corresponding output end, and at least one of the first end and the second end is folded and into bends.

Preferably, the signal transmission lines comprise a first pair of conducting wires including a first conducting wire and a second conducting wire, and a second pair of conducting wires including a third conducting wire and a fourth conducting wire. The second pair of conducting wires are respectively located on two sides of the first pair of conducting wires. The corresponding input ends corresponding to the first pair of conducting wires are respectively located between the first ends and the second ends of the first pair of conducting wires, and the corresponding input ends and the corresponding output ends corresponding to the second pair of conducting wires connect respectively therebetween the second pair of conducting wires.

In accordance with another aspect of the present invention, the two first ends of the first conducting wire and the third conducting wire are respectively folded into bends to mutually insert into each other to be alternately arranged, the two first ends of the second conducting wire and the fourth conducting wire are respectively folded into bends to mutually insert into each other to be alternately arranged, and the two second ends of the first conducting wire and the third conducting wire are respectively folded and meaningly extended to mutually insert into each other to be alternately arranged.

Preferably, the second end of the first conducting wire includes two extended segments separated at the corresponding output end corresponding to the second end of the first conducting line. Each of the first ends comprises a U-shaped portion and each of the second ends comprises a plurality of partially inter overlapped U-shaped portions. The second end of the second conducting wire includes two extended segments separated at the corresponding output end corresponding to the second end of the second conducting line.

The present invention may best be understood through the following description with reference to the accompanying drawings, in which:

DETAILED DESCRIPTION OF THE PREFERRED EMBODIMENT

Figure 1:
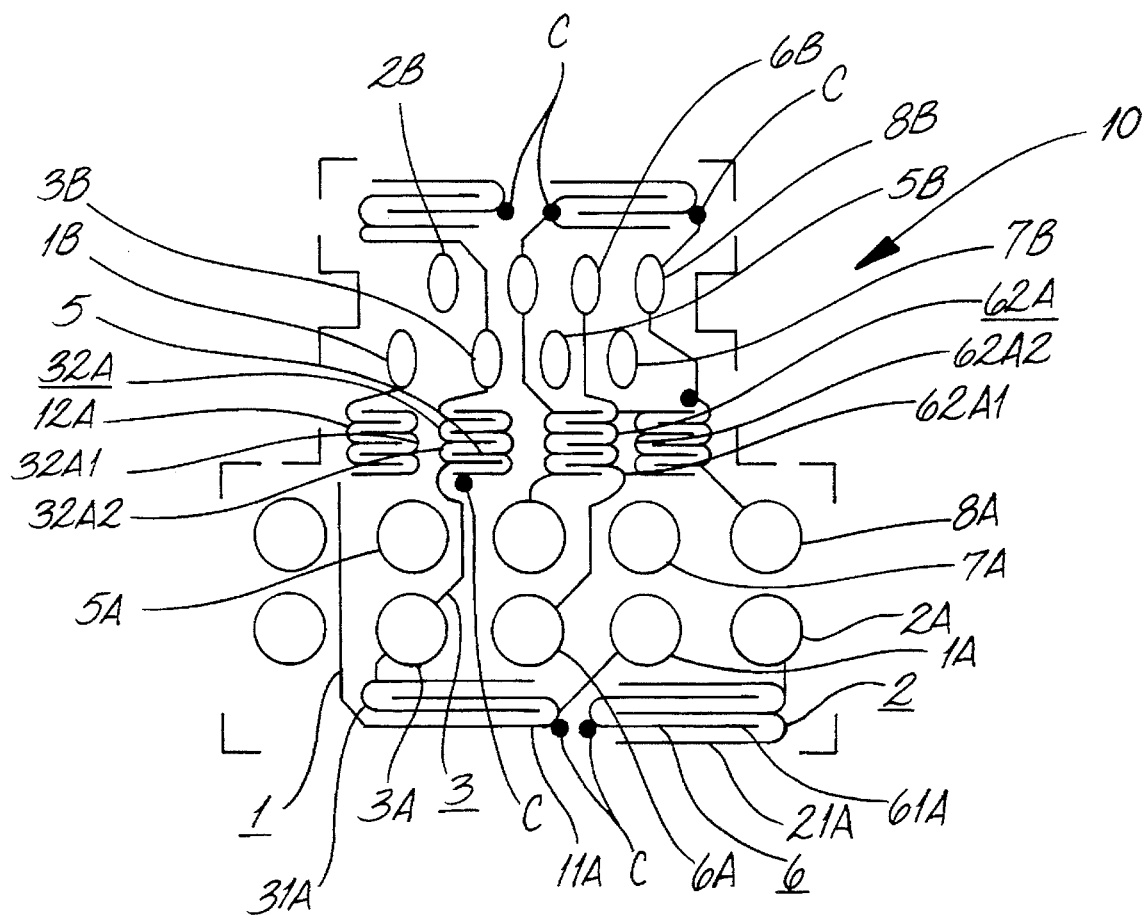
FIG. 1 is a top view showing a preferred embodiment of a low crosstalk electrical signal transmission medium of the present invention.
Figure 2:
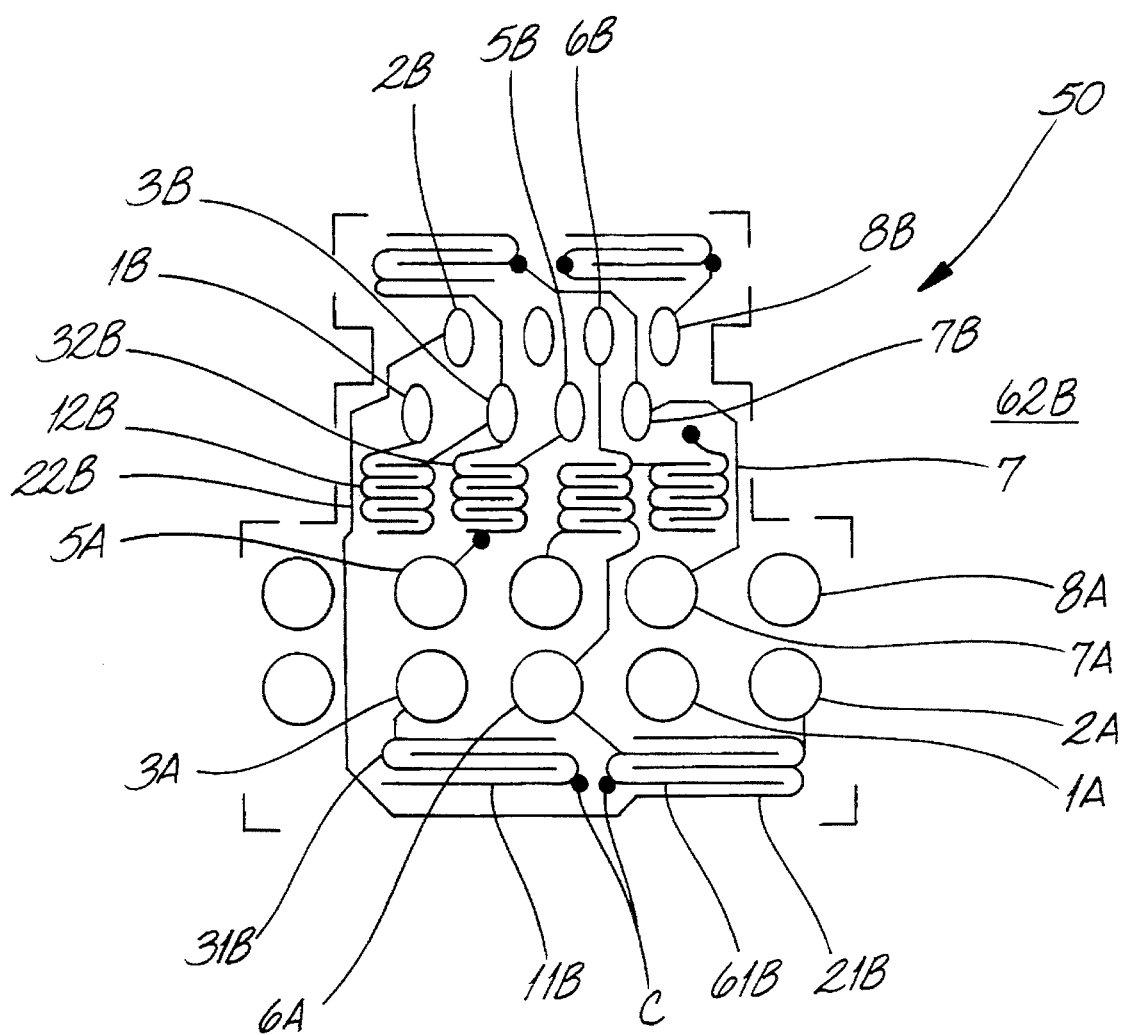
FIG. 2 is a bottom view showing a preferred embodiment of the bottom circuit of a low crosstalk electrical signal transmission medium of the present invention.

FIGS. 1 & 2, respectively show the front side circuit 10 and the rear side circuit 50 of a printed circuit board of a low electrical signal crosstalk transmission medium of the present invention. In the circuits, there are a first pair of conducting wires comprising a conducting wire 4 and a conducting wire 5, a second pair of conducting wires comprising a conducting wire 7 and a conducting wire 8, a third pair of conducting wires comprising a conducting wire 3 and a conducting wire 6 and a fourth pair of conducting wires comprising a conducting wire 1 and a conducting wire 2. The pair of conducting wires comprising conducting wire 3 and conducting wire 6 and the pair of conducting wires comprising conducting wire 1 and conducting wire 2 will be utilized for delineation of the present invention, in that, on the one hand, not necessarily four pairs of the conducting wires are all required and, on the other hand, the applied circuit theory is identical.

In accordance with the present invention, a low crosstalk electrical signal transmission medium includes a plurality of signal input ends 3A, 6A, 1A and 2A (which might further include ends 5A, 6A, 7A and 8A), a plurality of signal output ends 3B, 6B, 1B and 2B (which might further include ends 5B, 6B, 7B and 8B), and a plurality of signal transmission lines 3, 6, 1 and 2 (which might further include lines 5, 6, 7 and 8) respectively electrically connected to the aforementioned input ends 3A, 6A, 1A and 2A and output ends 3B, 6B, 1B and 2B. Each of the signal transmission lines 3, 6, 1 and 2 is folded into bends to mutually insert into each other to be alternately arranged to form a mutually corresponding capacitive arrangement for restoring an electric balance of the signal transmission lines 3, 6, 1 and 2 in order to reduce a crosstalk between two signal transmission lines. The front side circuit 10 and the opposite side circuit 50 are respectively printed on the two sides of the printed circuit board.

The input ends 3A, 6A, 1A and 2A, the output ends 3B, 6B, 1B and 2B and the through hole C are all filled with brass foil to electrically connect the two sides of the printed circuit board. The main purpose of the through hole C is to let the respective two portions of each of the signal transmission lines 3 and 6 and signal transmission lines 1 and 2, respectively provided on both sides of the printed circuit board, be mutually correspondingly electrically connected.

The signal transmission line 3 (6, 1 or 2) includes near the input end 3A (6A, 1A or 2A), the first front end 31A (61A, 11A or 21A) distributed on the front side circuit 10 and the first reverse end 31B (61B, 11B or 21B) distributed on the rear side circuit 50, and near the corresponding output end 3B (6B, 1B and 2B) the second from end 32A (62A or 12A) distributed on the front side circuit 10 and the second reverse end 32B (62 B, 12B and 22B) distributed on the rear side circuit 50. It is to be noted that the signal transmission line 2 does not posses a second end distributed on the front side circuit 10.

The first pair of conducting wires includes the transmission line 3 and the transmission line 6, and the second pair of conducting wires includes the transmission line 1 and the transmission line 2. The transmission lines 1 and 2 are located respectively on the two sides of the first pair Of conducting wires. One should note that the corresponding input ends 3A and 3B are respectively located between the first ends 31A, 61A (31B, 61B) and the second ends 32A, 62A (32B, 62B), whereas the corresponding input ends 1A and 2A and output ends 1B and 2B connect between the transmission lines 1 and 2, respectively.

The first ends 31A, 11A (31B, 11B) of both the first transmission line 3 and the third transmission line 1 include respectively U-shaped portions which are folded into bends to mutually insert into each other to be alternately arranged. The first ends 61A, 21A (61B, 21B) of both the second transmission line 6 and the fourth transmission line 2 include respectively U-shaped portions which are folded into bends to mutually insert into each other to be alternately arranged. The second ends 32A, 12A (32B, 12B) of both the first transmission line 3 and the third transmission line 1 include a plurality of partially inter overlapped U-shaped portions.

The second end 32A (62A) of the first (second) transmission line 3 (6) includes two extended segments 32A1, 32A2 (62A1, 62A2) separated at its corresponding output end 3B (6B). The isolated branches, e.g., 61A and 61B, or 11A and 11B, respectively on the two sides of the printed circuit board are mutually connected through a through hole C.

A NEXT test data of an exemplar of a signal transmission medium with four pairs of conducting wires constructed according to the aforementioned manner is tabulated in the following.

| Frequency MHz | Signal Pair 1-2 | Signal Pair 1-3 | Signal Pair 1-4 | Signal Pair 2-3 | Signal Pair 2-4 | Signal Pair 3-4 |
| --- | --- | --- | --- | --- | --- | --- |
| 1 | −92.963 | −83.786 | −94.874 | −88.818 | −86.279 | −88.151 |
| 4 | −89.54 | −77.6 | −82.873 | −77.309 | −73.625 | −80.835 |
| 8 | −81.557 | −71.264 | −74.613 | −73.972 | −68.733 | −74.754 |
| 10 | −81.559 | −69.931 | −73.147 | −72.615 | −66.92 | −71.336 |
| 16 | −76.612 | −65.794 | −69.325 | −68.714 | −62.782 | −68.122 |
| 20 | −75.458 | −64.593 | −66.938 | −66.723 | −60.886 | −66.003 |
| 25 | −71.45 | −62.367 | −64.903 | −64.26 | −58.95 | −63.921 |
| 31.25 | −69.659 | −59.764 | −62.773 | −62.333 | −56.791 | −62.305 |
| 62.5 | −57.462 | −54 | −55.288 | −56.396 | −50.928 | −55.915 |
| 100 | −49.766 | −50.09 | −49.805 | −52.622 | −46.644 | −51.243 |

Figure 3:
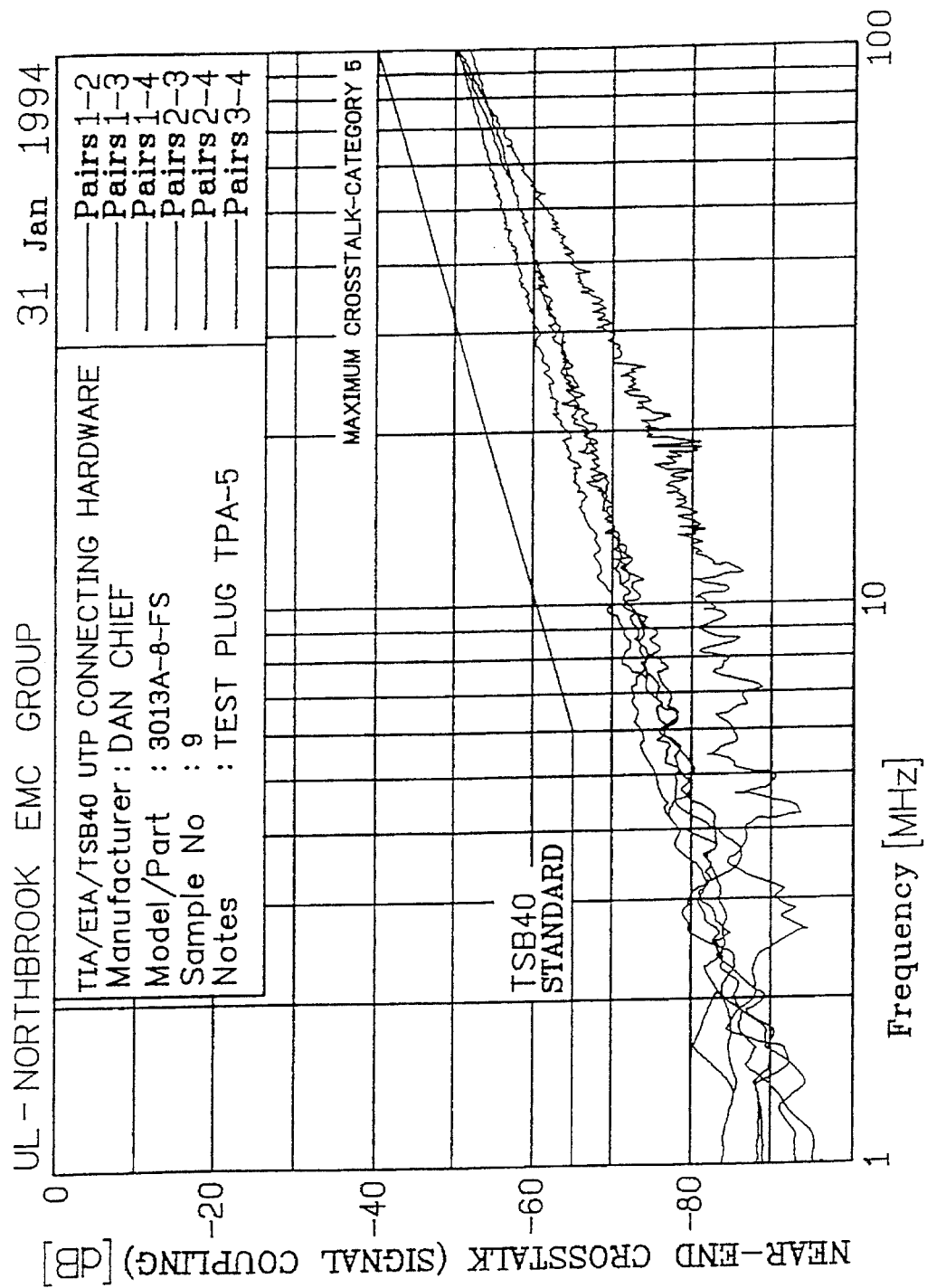
FIG. 3 is a testing data graph showing a preferred embodiment of a low electrical signal crosstalk transmission medium of the present invention.

FIG. 3 is plotted according to the test data of the above table, which shows that the crosstalk result of a signal transmission medium constructed according to the present invention is much better than the transmission requirements defined in TSB40.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What I claim is:

1. A low crosstalk electrical signal transmission medium comprising:

a plurality of input ends for inputting therethrough signals;

a plurality of signal transmission lines respectively electrically connected to said plurality of input ends and being folded into bends and electrically coupled to form a mutually corresponding capacitive arrangement for restoring an electric balance of said signal transmission lines in order to reduce a crosstalk between said signal transmission lines; and a plurality of output ends respectively electrically connected to said signal transmission lines for outputting therethrough signals.

2. A low crosstalk signal transmission medium according to claim 1, which is formed into a printed circuit board.

3. A low crosstalk electrical signal transmission medium according to claim 2, wherein each of said signal transmission lines is formed on both a front side and a back side of said printed circuit board.

4. A low crosstalk electric signal transmission medium according to claim 3, wherein each of said signal transmission lines on said front side is electrically connected to its respective signal transmission line on said back side.

5. A low crosstalk signal transmission medium according to claim 2, wherein any one of said input ends and said output ends passes through said printed circuit board.

6. A low crosstalk signal transmission medium according to claim 5, wherein each of said signal transmission lines comprises a first end near a corresponding said input end and a second end near a corresponding said output end, and at least one of said first end and said second end is folded into bends.

7. A low crosstalk electrical signal transmission medium according to claim 6, wherein said transmission lines comprise a first pair of conducting wires including a first conducting wire and a second conducting wire and a second pair of conducting wires including a third conducting wire and a fourth conducting wire.

8. A low crosstalk electrical signal transmission medium according to claim 7, wherein said second pair of conducting wires are respectively located on two sides of said first pair of conducting wires.

9. A low crosstalk electrical signal transmission medium according to claim 7, wherein said corresponding input ends corresponding to said first pair of conducting wires are respectively located between said first ends and said second ends of said first pair of conducting wires, and said corresponding input ends and said corresponding output ends corresponding to said second pair of conducting wires connect respectively therebetween said second pair of conducting wires.

10. A low crosstalk electrical signal transmission medium according to claim 9, wherein said first ends of said first conducting wire and said third conducting wire are respectively folded into bends and mutually inserted into each other to be alternately arranged for electrical coupling therebetween; said first ends of said second conducting wire and said fourth conducting wire are respectively folded into bends and mutually inserted into each other to be alternately arranged for electrical coupling therebetween; and said second ends of said first conducting wire and said third conducting wire are respectively folded into bends and mutually inserted into each other to be alternately arranged for electrical coupling therebetween.

11. A low crosstalk electrical signal transmission medium according to claim 10, wherein said second end of said first conducting wire comprises two extended segments separated at said corresponding output end corresponding to said second end of said first conducting wire.

12. A low crosstalk electrical signal transmission medium according to claim 10, wherein each of said first ends comprises a U-shaped portion.

13. A low crosstalk electrical signal transmission medium according to claim 10, wherein each of said second ends comprises a plurality of partially inter overlapped U-shaped portions.

14. A low crosstalk electrical signal transmission medium according to claim 10, wherein said second end of said second conducting wire comprises two extended segments separated at said corresponding output end corresponding to said second end of said second conducting wire.

* * * * *